US006350360B1

(12) United States Patent
Bonivert et al.

(10) Patent No.: US 6,350,360 B1
(45) Date of Patent: Feb. 26, 2002

(54) METHOD OF FABRICATING A 3-DIMENSIONAL TOOL MASTER

(75) Inventors: William D. Bonivert, Pleasanton; John T. Hachman, Stockton, both of CA (US)

(73) Assignee: Sandia Coroporation, Livermore, CA (US)

( * ) Notice: Subject to any disclaimer, the term of this patent is extended or adjusted under 35 U.S.C. 154(b) by 0 days.

(21) Appl. No.: 09/544,703

(22) Filed: Apr. 7, 2000

(51) Int. Cl.$^7$ ................................................. C25D 1/00
(52) U.S. Cl. .............................. 205/67; 205/69; 205/70
(58) Field of Search ............................. 205/67, 68, 69, 205/70

(56) References Cited

U.S. PATENT DOCUMENTS

| | | | |
|---|---|---|---|
| 4,035,226 A | 7/1977 | Farber et al. | |
| 4,478,769 A | 10/1984 | Pricone et al. | |

OTHER PUBLICATIONS

Klapprott,D.; Cedarleaf, C.; "Imprint Patterning—Emerging Materials & Processing Technology," Nepcon West, Session TS, Mar. 1998, 5 pp. No Month Avail.

IC Packaging Update 1999, "Imprint Patterning" Published by Intergrated Circuit Engineering Corporation, Eric Botagin, Ed., 1999, pp. 7–10 and 7–11. No Month Avail.

Casey, B.G.; Monaghan, W.; Wilkinson, C.D.W.; Embossing of Nanoscale Features and Environments; Microelectronic Engineering, vol. 35, Issue: 1–4; pp. 393–396, Feb. 1997.*

Lebib, A.; Chen, Y.; Bourneix, J.; Carcenac, F.; Cambril, E.; Couraud, L.; Launois, H.; Nanoimprint lithography for a large area pattern replication, Microelectronic Engineering, vol.: 46, Issue 1–4; pp. 319–322, May 1999.*

* cited by examiner

Primary Examiner—Kathryn Gorgos
Assistant Examiner—Wesley A. Nicolas
(74) Attorney, Agent, or Firm—John P. Wooldridge

(57) ABSTRACT

The invention is a method for the fabrication of an imprint tool master. The process begins with a metallic substrate. A layer of photoresist is placed onto the metallic substrate and a image pattern mask is then aligned to the mask. The mask pattern has opaque portions that block exposure light and "open" or transparent portions which transmit exposure light. The photoresist layer is then exposed to light transmitted through the "open" portions of the first image pattern mask and the mask is then removed. A second layer of photoresist then can be placed onto the first photoresist layer and a second image pattern mask may be placed on the second layer of photoresist. The second layer of photoresist is exposed to light, as before, and the second mask removed. The photoresist layers are developed simultaneously to produce a multi-level master mandrel upon which a conductive film is formed. A tool master can now be formed onto the conductive film. An imprint tool is then produced from the tool master. In one embodiment, nickel is electroplated onto the tool master to produce a three-dimensional imprint tool.

34 Claims, 3 Drawing Sheets

Stainless Steel or Titanium sheet 0.090″ minimum thickness

Laminate dry film photoresist layer

Align negative trace image and expose

Pull cover sheet (clear 0.001 mylar)

Laminate second dry film photoresist layer

Align secound negative trace image and expose

Pull cover sheet (clear 0.001 mylar)

Develop both exposed dry film photoresist layers at same time

PVD Cu film

Electroplate thick nickel 0.030"- 0.040" thickness

Separate thick nickel master from stainless steel or titanium base, remove Cu and photoresist residue Using master, electroplate 0.011"- 0.013" thick nickel tool Separate tool from master

METHOD OF FABRICATING A 3-DIMENSIONAL TOOL MASTER

The United States Government has rights in this invention pursuant to Contract No. DE-AC04-94AL85000 between the United States Department of Energy and Sandia Corporation for the operation of Sandia National Laboratories.

BACKGROUND OF THE INVENTION

1. Field of the Invention

The present invention relates to circuit board fabrication and more specifically, it relates to a method for fabricating three dimensional imprint tools.

2. Description of Related Art

Previous attempts by others in making imprint tools have suffered largely in two areas. Firstly, the process required two plating steps and the adhesion of the nickel layers was insufficient. Secondly, they lacked control of the height/depth and the cross-sectional areas of the features were not accurately reproduces in the thermoset laminate material. These are both serious issues affecting the replication and functionality of the final product.

One method of making an imprint tool included etching a copper substrate to make a master. A pattern is chemically milled into the copper sheet and a nickel tool is electroformed from the master. Problems with this method include lack of control of the depth of the etch over large areas and the typical rounding of the pattern sidewall from etching. These are both serious problems since etching deeper causes more rounding and greater distortion of the pattern.

A second method uses a two-step plating process to form the trace and stud/via. This process starts with patterning the traces on a nickel sheet and plating the traces with nickel. This is followed by applying another photoresist layer and patterning the studs. This method suffered from lack of adhesion between the nickel layers, trace/stud, as well as the substrate. It is difficult aligning the second pattern over the first plated layer and it was difficult controlling the height of the studs during the second plating.

It is desirable to provide methods for making an imprint tool that are superior to the methods described above in eliminating adhesion problems, in controlling the feature height and in providing superior trace and stud cross-sectional areas.

SUMMARY OF THE INVENTION

It is an object of the present invention to provide a process for fabricating three dimensional imprint tools.

It is another object of the invention to eliminate adhesion issues by electroforming the trace/stud as an integral component.

Another object of the invention is to provide a method for controlling feature height and for overcoming overplating or geometry current density issues.

Still another object of the invention is to provide a method for fabricating three dimensional imprint tools having trace and stud cross-sectional areas that are superior over trace and stud cross-sectional areas produced with etching or by the prior art two step process.

To maintain consistency in the fabricated tool, the present invention provides a method for fabricating a tool Master from which the embossing tool of the present invention are made. The present method allows robustness to be built into the tool Master by making it any desired thickness. The use of two layers of dry film photoresist is unique to this invention. This method provides a tool designer the opportunity to incorporate any combination of embossing features into the design of the tool, including, but not limited to, features as small as a few microns to as much as 50 micron or more. Furthermore, the present invention also affords the flexibility to design tools having features of varying geometry "stacked" one on top of another feature, thus providing for a multi-level imprinting tool.

The use of liquid photoresist can also be used in this method, as well as the utilization of dry film photoresist. The dry film photoresist is produced with a very controlled manufacturing process that affords control over the thickness or height of the features that are grown.

Imprint technology can be used in all sectors of government and industry currently using conventional printed circuit technology. The present invention is useful in high density circuit fabrication because the via or plated through-hole is made concurrently with the trace formation. This allows closer spacing of traces and eliminates the need for large angular rings (pads) around the vias. This imprint technology eliminates several wet processing steps used in current technology, resulting in increased production quantity and decreased production cost compared to existing imprint technology.

The instant invention, therefore, is a method for the fabrication of an imprint tool Master and a method for fabricating an embossing tool using the tool Master. The process begins with a sheet of stainless steel or titanium having a thickness of about 0.090 inches. Stainless steel and titanium, of course, are illustrative materials only. Other choices of materials and material sheet thicknesses are possible so long as the choice is electrically conductive and exhibits a reasonable stiffness-to-weight ratio. A dry photoresist film is first laminated onto the stainless steel or titanium substrate sheet. (Liquid photoresist can also be used in this method, as an alternate to the use of dry film photoresist; however, the dry film photoresist contributes to a very controlled manufacturing process that affords control over the thickness or height of the features that are grown.) A mask comprising a negative trace image of a desired pattern, a circuit pattern for example, is then placed on the dry film photoresist and the film exposed to light through the mask openings. The mask and the Mylar cover sheet are then removed and a second dry film photoresist is laminated onto the first dry photoresist film if a multi-layer structure is desired. In such cases, a second mask comprising a second negative trace image is aligned over the second dry film photoresist and the second film exposed as was the first.

The next step in this process is to use standard developing methods to develop both of the exposed dry film photoresist layers at the same time. This results in the removal of the unexposed portions of the dry film photoresist layers, leaving only the exposed portions on the stainless steel or titanium substrate sheet. The surface of this sheet and the developed portions of the photoresist are then covered with a copper film in order to form a conductive adhesion layer and a thick plate of nickel electroplated onto the copper layer. This nickel layer is typically about 0.030 inches to about 0.040 inches thick but thicker or thinner layers are possible, and may be desirable, given a particular end-use circumstance.

In a final step, the electroplated thick nickel layer is removed from the stainless steel or titanium sheet, is cleaned to remove copper and photoresist residue, and is chemically passivated for further processing.

The cleaned nickel plate now embodies a tool master, from which an embossing tools can be fabricated.

DETAILED DESCRIPTION OF THE INVENTION

The present invention is a process for fabricating three dimensional imprint tools. This process eliminates any adhesion issues by electroforming the trace/stud as an integral component. The feature height is controlled by plating the tool master in reverse order, which removes any overplating or geometry current density issues. The cross-sectional area of the trace and studs are superior over trace and studs produced with etching or by the prior art two step process.
General Description The invention is generally a method for the fabrication of an imprint tool master. The process begins with a metallic substrate. A layer of photoresist is placed onto the metallic substrate and a mask pattern, hereinafter a circuit pattern is described for illustrative purposes, is then aligned to the mask. The circuit pattern mask has opaque portions that block exposure light and "open" or transparent/translucent portions that transmit exposure light. The photoresist layer is then exposed to light transmitted through the "open" or transparent/translucent portions of the first circuit pattern mask and the circuit pattern mask is then removed. A second layer of photoresist is then placed onto the first photoresist layer and a second circuit pattern mask is placed on the second layer of photoresist. The second layer of photoresist is then exposed to light and the second circuit pattern mask is removed. The photoresist layers are developed simultaneously to produce a master mandrel upon which a conductive film is formed. A tool master is then formed onto the conductive film. An imprint tool is produced from the tool master. In one embodiment, nickel is electroplated onto the tool master to produce a three-dimensional imprint tool.
Specific Description An embodiment of the steps of the invention are described with reference to FIGS. 1A through 1D and continues with reference to FIGS. 2A through 2D and is completed in FIGS. 3A through 3E.

As required, detailed embodiments of the present invention are disclosed herein. However, it is to be understood that the disclosed embodiments are merely exemplary of the present invention which may be embodied in various systems. Therefore, specific details disclosed herein are not to be interpreted as limiting, but rather as a basis for the claims and as a representative basis for teaching one skilled in the art to variously practice the present invention.

Figure 1A:
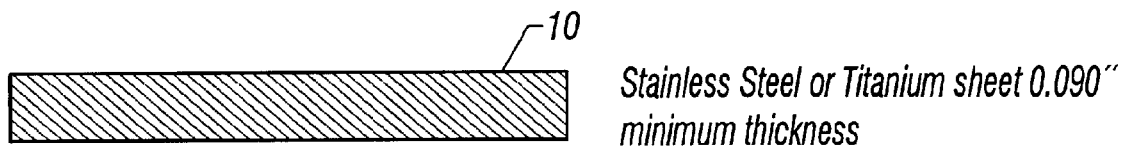
FIG. 1A shows the first step in an embodiment of the present method where a sheet of stainless steel or titanium is provided.
Figure 1B:
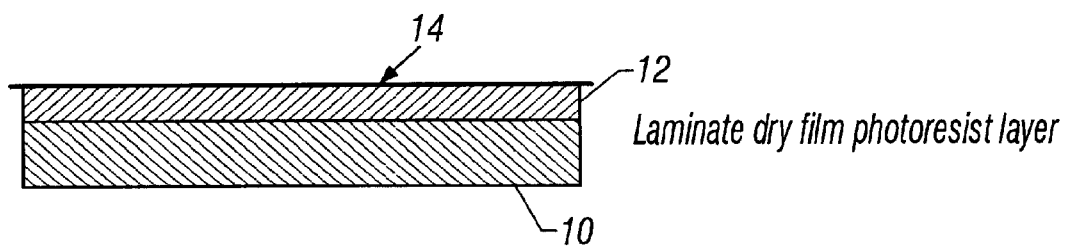
FIG. 1B illustrates the lamination of photoresist film onto the sheet.

Referring to FIG. 1A, the process begins with a sheet 10 of stainless steel or titanium, for example. This sheet should be about 0.090 inches thick. A dry photoresist film 12, usually about 0.002 inches thick, is then laminated onto the sheet 10, as shown in FIG. 1B. This dry film photoresist is known as "out of the box dry film." Dry photoresist film usually includes a Mylar cover sheet 14. As discussed above, liquid photoresist can also be used in this method, as an alternate to the use of dry film photoresist; however, the dry film photoresist contributes to a very controlled manufacturing process that affords control over the thickness or height of the features that are grown.

Figure 1C:
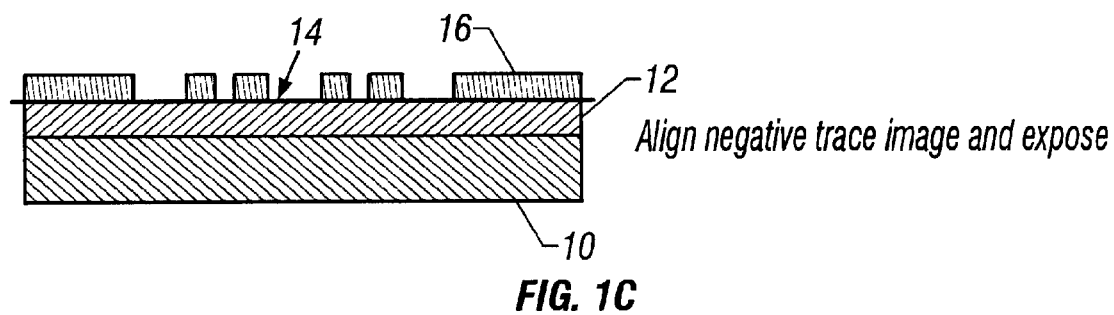
FIG. 1C shows the placement of a negative trace image of a desired circuit pattern on the photoresist.
Figure 1D:
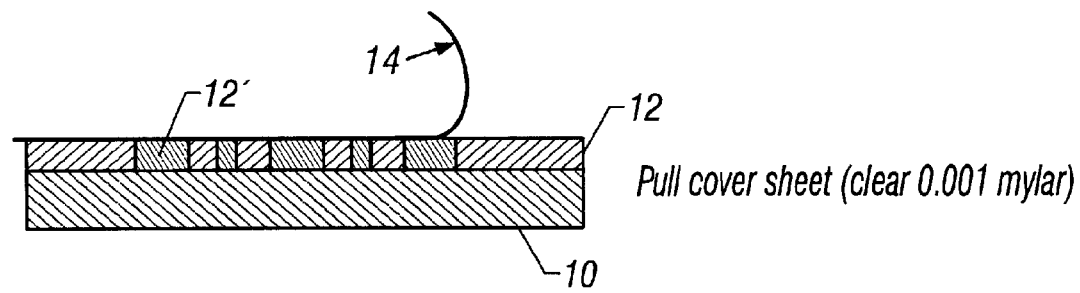
FIG. 1D shows the removal of the negative trace image from the photoresist.

In the next step, as shown in FIG. 1C, a negative trace image 16 of a desired circuit pattern is placed on the cover sheet 14 of the dry film photoresist 12. The desired circuit pattern will coincide with the clear or transparent/translucent portions of the negative trace image 16. The dry film photoresist 12 is then subjected to light exposure through the negative trace image 16. Referring to FIG. 1D, the negative trace image 16 and the Mylar cover sheet 14 are removed. The clear Mylar cover sheet 14 is about 0.001 inches thick. The remaining material comprises stainless steel or titanium sheet 10, which carries dry photoresist film 12, which includes exposed portions 12'.

Figure 2A:
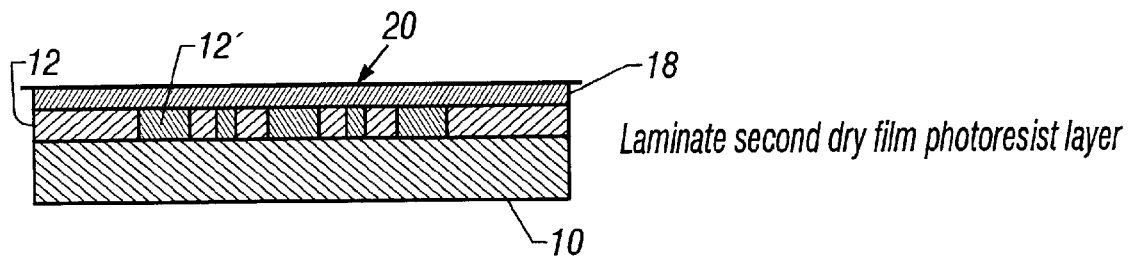
FIG. 2A illustrates the lamination of a second photoresist film onto the first photoresist film.

A second dry film photoresist 18 (out of the box dry film) with a second clear Mylar cover sheet 20 (about 0.001 inches thick) is then laminated onto the dry photoresist film 12 (which includes exposed portions 12'), as shown in FIG. 2A. Dry films 12 and 18 are here the same material. They are distinguished from one another in order to distinguish their use in separate process steps and to suggest that, although the use of identical materials is disclosed it is not necessary that they be identical. Furthermore, the thicknesses of the two photoresist films likely will be different in order to provide for differing feature heights in the finished tool.

Figure 2B:
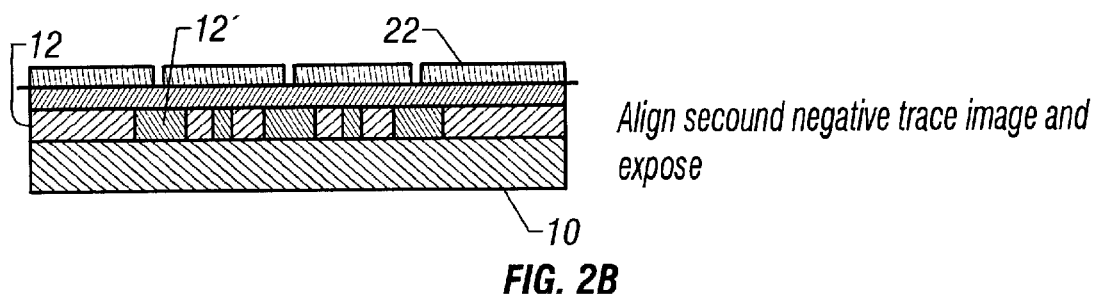
FIG. 2B shows the step of aligning a second negative trace image onto the second film of photoresist.
Figure 2C:
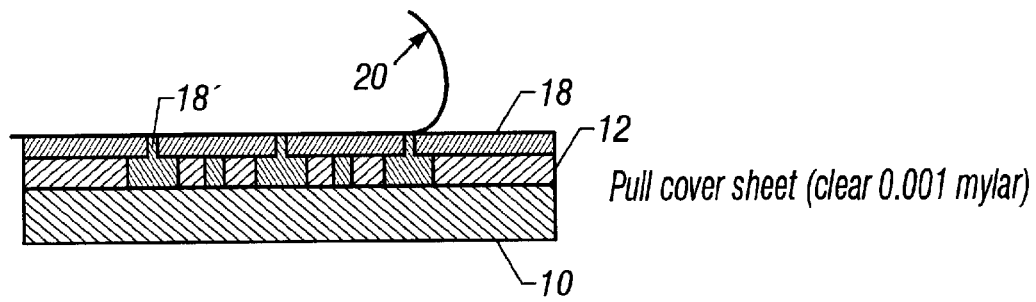
FIG. 2C shows the removal of the second negative trace image from the second film of photoresist.

The next step of aligning a second negative trace image 22 onto the dry film photoresist 18 is illustrated in FIG. 2B. The desired stud pattern should coincide with the clear or transparent/translucent portions of the negative trace image 22. Using a standard circuit board exposure light source, the second dry film photoresist layer 18 is then exposed. As shown in FIG. 2C, the negative trace image 22 and the clear Mylar cover sheet 20 then are removed. The remaining material comprises stainless steel or titanium sheet 10, which carries dry photoresist film 12, which carries dry photoresist layer 18, which includes exposed portions 18'.

Figure 2D:
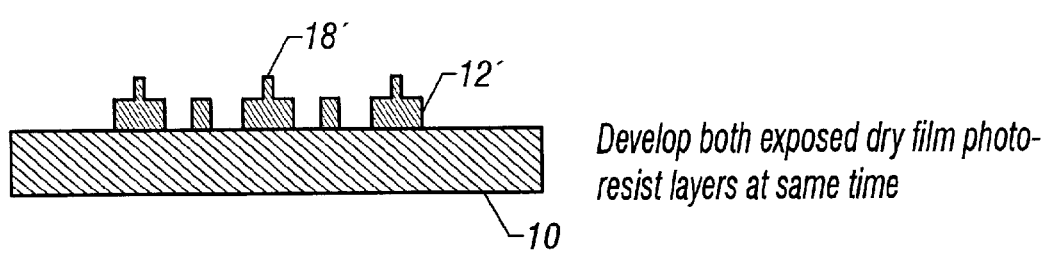
FIG. 2D illustrates the step of developing both of the exposed photoresist films.

As shown in FIG. 2D, the next step is to use standard developing methods to develop both of the exposed dry film photoresist layers 12 and 18 at the same time. This results in the removal of the unexposed portions of the dry film photoresist layers 12 and 18, leaving only the exposed portions 18' on 12' which is on sheet 10.

Figure 3A:
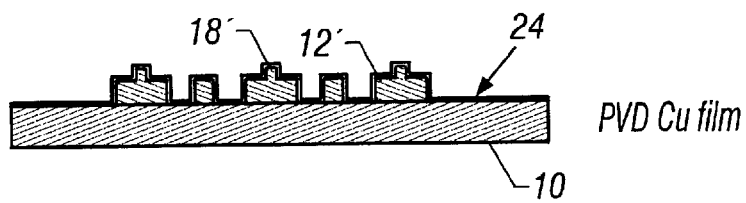
FIG. 3A shows the stainless steel or titanium sheet, upon which is the developed exposed portions of both photoresist layers, upon which copper is deposited.

FIG. 3A illustrates sheet 10, also referred to as a Master mandrel, upon which is the developed exposed portion 12' upon which is the developed exposed portions 18'. The surface of this sheet 10 and the developed portions 12' and 18' are then covered with a thin electrically conductive film 24 through a particle vapor deposition (PVD) process, although any other coating process which would provide a thin, continuous layer of material would be equally effective. Such methods include, but are not limited to, sputtering and chemical vapor deposition metal or metalloids, and dipping, spraying, or spin coating materials solutions or suspensions and only require that the coating process not damage the photoresist layer and result in a continuous, conductive layer.

As disclosed herein, film 24 is copper, but could be any similar material including any of the Transition series of metal listed in New IUPAC Group Numbers 4–12 of the Period Table of elements, and alloys thereof, certain of the metals and metalloids of Groups 13 and 14, conductive polymers, as well as colloidal suspensions and paints of any of the foregoing materials. This film is necessary to enable adherence of a first thick metal layer 26 which is deposited in a subsequent step. In the present invention, layer 26 is nickel but, as before, it could be any similar metal selected from the Transition series of metal listed in New IUPAC Group Numbers 4–12 of the Period Table of elements, as well as tin, or any alloy thereof providing that layer 26 is dissimilar to film 24.

Figure 3B:
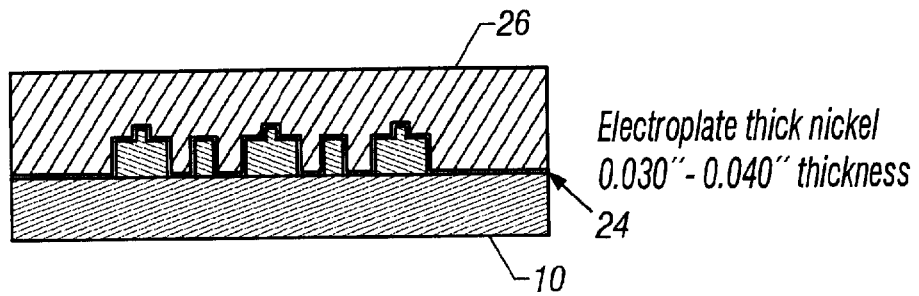
FIG. 3B shows a thick plate of nickel electroplated onto the copper layer of FIG. 3A.

Referring to FIG. 3B, a thick layer 26 of nickel is electroplated onto the film 24 in this subsequent step. The nickel layer of the present invention is here about 0.030 inches to about 0.040 inches thick. The use of nickel and the thickness of this layer is, however, illustrative only. Layer 26 could be nickel or any similar metal selected from the Transition series of metal listed in New IUPAC Group Numbers 4–12 of the Period Table of elements, as well as tin, or any alloy thereof, depending upon the use desired (if for instance a harder material was required). Thinner or thicker layers are also possible, and may be even be desirable, depending upon the particular circumstance of the intended end-use.

Figure 3C:
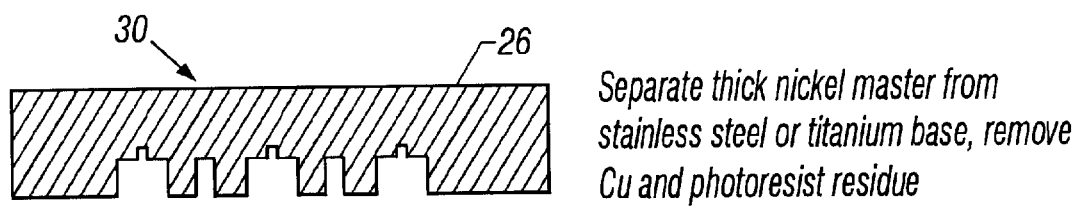
FIG. 3C shows the removal of the thick plate of nickel from the stainless steel or titanium sheet to form the tool master.

The final step in fabricating a tool master 30 is illustrated in FIG. 3C where the thick layer 26 of nickel is removed from the stainless steel or titanium sheet (substrate base) 10. After layer 26 is cleaned to remove copper and photoresist residue, it now describes a tool master 30 from which embossing tools can be fabricated.

Figure 3D:
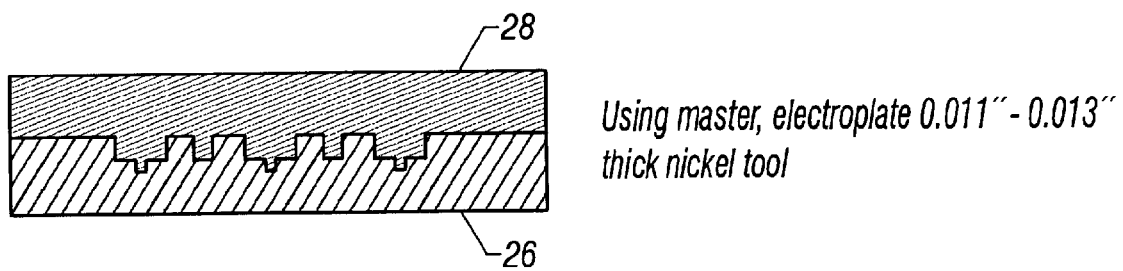
FIG. 3D shows the step of electroplating the tool master with nickel to produce an embossing tool.

The step of fabricating an embossing tool 40 from the tool master 30 is illustrated schematically in FIG. 3D. This final step of forming embossing tool 40 by electroplating a desired thickness of a second thick metal layer 28 onto the tool master 30. Again, as before, layer 28 could be nickel or any similar metal selected from the Transition series of metal listed in New IUPAC Group Numbers 4–12 of the Period Table of elements, as well as tin, or any alloy thereof. Before electroforming embossing tool 40, however, nickel tool master 30 is dipped into a dilute aqueous solution of sodium dichromate (30 to 60 seconds in 1 gm/l of water) to passivate the plating surface. The choice of passivating solutions, of course, will depend upon the metal chosen to form tool master 30.

Figure 3E:
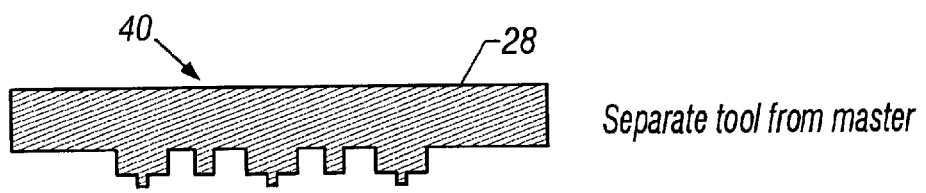
FIG. 3E shows the final embossing tool separated from the tool master.

Typically, the tool 40 is electroplated onto the tool master 30 until it reaches a thickness of between 0.010 inches and 0.013 inches. However, thickness greater than these are possible, and may even be desirable. Fabrication of such thick sheets is limited only by the plating apparatus and the plating time necessary to achieve the desired thickness. As shown in FIG. 3E, the final tool 40 is then separated from the nickel tool master 30, is cleaned, and is then ready for use as an embossing tool.

The foregoing description of the invention has been presented for purposes of illustration and description and is not intended to be exhaustive or to limit the invention to the precise form disclosed. Many modifications and variations are possible in light of the above teaching. The embodiments were chosen and described to best explain the principles of the invention and its practical application to thereby enable others skilled in the art to best use the invention in various embodiments and with various modifications suited to the particular use contemplated. The scope of the invention is to be defined by the following claims.

What is claimed is:

1. A method for fabricating an imprint tool master, comprising the step of:
   a.) providing a metal plate or sheet;
   b.) forming a first photoresist layer onto said metal plate or sheet;
   c.) aligning an image pattern mask onto said first photoresist layer, wherein said image pattern mask has portions that block exposure light and portions which transmit exposure light;
   d.) exposing said first photoresist layer with a first exposure of exposure light;
   e.) removing said first image pattern mask;
   f.) developing said first photoresist layer to provide a surface having a 3-dimensional embossing pattern;
   g.) depositing a conductive film onto said surface thereby providing a master mandrel;
   h.) electroforming a first metal layer on said conductive film; and
   i.) separating said first metal layer from said master mandrel wherein said first metal layer comprises said imprint tool master, said imprint tool master having a surface comprising an inverse 3-dimensional image of said embossing pattern, said inverse 3-dimensional image comprising a plurality of recesses.

2. The method of claim 1, wherein the step of depositing comprises depositing by particle vapor deposition.

3. The method of claim 1, further comprising the steps of:
   a.) passivating said imprint tool master;
   b.) electroforming a second metal layer onto said surface so as to fill said plurality of recesses; and
   c.) separating said second metal layer from said imprint tool master, wherein said second metal layer comprises an embossing tool, said second metal layer having a surface comprising a positive 3-dimensional profile of said embossing pattern.

4. The method of claim 3, wherein the step of electroforming includes electroplating a metal selected from the group consisting of the Transition series of metal listed in New IUPAC Group Numbers 4–12 of the Period Table of elements, tin, and any alloy thereof.

5. The method of claim 4, wherein said metal is nickel.

6. The method of claim 1, wherein the metal plate or sheet is a stainless steel plate or sheet.

7. The method of claim 6, wherein said stainless steel comprises a sheet that is about 0.090 inches thick.

8. The method of claim 1, wherein the metal plate or sheet is a titanium plate or sheet.

9. The method of claim 8, wherein said titanium comprises a sheet that is about 0.090 inches thick.

10. The method of claim 1, wherein the step of forming a first photoresist layer comprises forming a first dry film photoresist layer on said metal plate or sheet.

11. The method of claim 1, wherein the step of forming a first photoresist layer comprises forming a first wet photoresist layer onto said metal plate or sheet.

12. The method of claim 1, wherein the step of aligning an image pattern mask comprises aligning a positive trace image pattern mask.

13. The method of claim 1, wherein the step of aligning an image pattern mask comprises aligning a negative trace image pattern mask.

14. The method of claim 1, wherein the step of forming a first photoresist layer comprises forming a first dry film photoresist layer.

15. The method of claim 1, wherein the step of forming a first photoresist layer comprises forming a first wet photoresist layer.

16. The method of claim 1, wherein said step of depositing comprises depositing a copper film.

17. A method for fabricating an imprint tool master, comprising the step of:
  a.) providing a metal plate or sheet;
  b.) forming a first photoresist layer onto said metal plate or sheet;
  c.) aligning a first image pattern mask onto said first photoresist layer, wherein said first image pattern mask has first portions that block exposure light and second portions which transmit exposure light;
  d.) exposing said first photoresist layer with a first exposure of exposure light;
  e.) removing said first image pattern mask;
  f.) forming a second photoresist layer onto said first photoresist layer;
  g.) aligning a second pattern mask having a second desired pattern onto said second photoresist layer, wherein said second pattern mask has first portions that block exposure light and second portions which transmit exposure light;
  h.) exposing said second photoresist layer with a second exposure of said exposure light;
  i.) removing said second pattern mask;
  j.) developing said first photoresist layer to provide a surface having a 3-dimensional embossing pattern;
  k.) depositing a conductive film onto said surface thereby providing a master mandrel;
  l.) electroforming a first metal layer on said conductive film; and
  m.) separating said first metal layer from said master mandrel wherein said first metal layer comprises said imprint tool master, said imprint tool master having a surface comprising an inverse 3-dimensional image of said embossing pattern, said inverse 3-dimensional image comprising a plurality of recesses.

18. The method of claim 17, further comprising the steps of:
  a.) passivating said imprint tool master;
  b.) electroforming a second metal layer onto said imprint tool master surface so as to fill said plurality of recesses; and
  c.) separating said second metal layer from said imprint tool master, said second metal layer comprising an embossing tool, said second metal layer having a surface comprising said 3-dimensional embossing pattern.

19. The method of claim 18, wherein the step of electroforming includes electroplating a metal selected from the group consisting of the Transition series of metal listed in New IUPAC Group Numbers 4–12 of the Period Table of elements, tin, and any alloy thereof.

20. The method of claim 19, wherein said metal is nickel.

21. The method of claim 17, wherein the metal plate or sheet is a stainless steel plate or sheet.

22. The method of claim 21, wherein said stainless steel plate comprises a stainless steel plate that is about 0.090 inches thick.

23. The method of claim 17, wherein the metal plate or sheet is a titanium plate or sheet.

24. The method of claim 23, wherein said titanium plate comprises a titanium plate that is about 0.090 inches thick.

25. The method of claim 17, wherein the step of forming a first photoresist layer comprises forming a first dry film photoresist layer on said metal plate or sheet.

26. The method of claim 17, wherein the step of forming a first photoresist layer comprises forming a first wet photoresist layer onto said metal plate or sheet.

27. The method of claim 17, wherein the step of aligning a first image pattern mask comprises aligning a first positive trace image pattern mask.

28. The method of claim 17, wherein the step of aligning a first image pattern mask comprises aligning a first negative trace image pattern mask.

29. The method of claim 17, wherein the step of forming a second photoresist layer comprises forming a second dry film photoresist layer.

30. The method of claim 17, wherein the step of forming a second photoresist layer comprises forming a second wet photoresist layer.

31. The method of claim 17, wherein the step of aligning a second image pattern mask comprises aligning a second positive trace image pattern mask.

32. The method of claim 17, wherein the step of aligning a second image pattern mask comprises aligning a second negative trace image pattern mask.

33. The method of claim 17, wherein the step of depositing comprises depositing by particle vapor deposition.

34. The method of claim 17, wherein said step of depositing comprises depositing a copper film.

* * * * *